US008535760B2

(12) United States Patent
Hurley et al.

(10) Patent No.: US 8,535,760 B2
(45) Date of Patent: Sep. 17, 2013

(54) ADDITIVES TO SILANE FOR THIN FILM SILICON PHOTOVOLTAIC DEVICES

(75) Inventors: Patrick Timothy Hurley, Allentown, PA (US); Robert Gordon Ridgeway, Quakertown, PA (US); Katherine Anne Hutchison, Sunnyvale, CA (US); John Giles Langan, Breinigsville, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 320 days.

(21) Appl. No.: 12/872,806

(22) Filed: Aug. 31, 2010

(65) Prior Publication Data

US 2011/0061733 A1 Mar. 17, 2011

Related U.S. Application Data

(60) Provisional application No. 61/241,466, filed on Sep. 11, 2009.

(51) Int. Cl.
*C23C 16/24* (2006.01)

(52) U.S. Cl.
USPC .......... 427/255.27; 427/255.39; 427/255.393

(58) Field of Classification Search
USPC ............ 427/255.23, 255.27, 255.39, 255.393
See application file for complete search history.

(56) References Cited

U.S. PATENT DOCUMENTS

| | | | | |
|---|---|---|---|---|
| 4,499,331 A * | 2/1985 | Hamakawa et al. | .......... | 136/258 |
| 5,017,308 A | 5/1991 | Iijima et al. | | |
| 5,082,696 A * | 1/1992 | Sharp | .............. | 427/255.14 |
| 5,278,015 A * | 1/1994 | Iwamoto et al. | ............ | 430/95 |
| 6,215,061 B1 * | 4/2001 | Kariya | .................. | 136/256 |
| 6,468,885 B1 * | 10/2002 | Mahan et al. | ............. | 438/482 |
| 6,592,539 B1 | 7/2003 | Einarsson et al. | | |
| 6,784,361 B2 * | 8/2004 | Carlson et al. | ............ | 136/258 |
| 6,855,621 B2 | 2/2005 | Kondo et al. | | |
| 2002/0046766 A1 * | 4/2002 | Carlson et al. | ............ | 136/258 |
| 2002/0066581 A1 | 6/2002 | Bashford | | |
| 2007/0298590 A1 | 12/2007 | Choi et al. | | |
| 2008/0223440 A1 * | 9/2008 | Sheng et al. | ............ | 136/258 |
| 2008/0245414 A1 * | 10/2008 | Sheng et al. | ............ | 136/261 |
| 2009/0077805 A1 | 3/2009 | Bachrach et al. | | |

FOREIGN PATENT DOCUMENTS

| | | |
|---|---|---|
| CN | 1144573 A | 3/1997 |
| EP | 0 229 707 A2 | 7/1987 |
| GB | 2 319 662 A | 5/1998 |
| JP | 2005-244037 A | 9/2005 |

OTHER PUBLICATIONS

Kroll, U., et al., "Hydrogen in amorphous and microcrystalline silicon films prepared by hydrogen dilution". Journal of Applied Physics 80, issue 9, 4971-4975, 1996.*

Vanier, P.E., et al., "A study of hydrogenated amorphous silicon deposited by rf glow discharge in silane-hydrogen mixtures". J. Appl. Phys. 56 (6), Sep. 15, 1984, pp. 1812-1820.*

Yoon, Jong-Hwan, et al., "Light-induced effects in hydrogenated amorphous silicon films grown from high hydrogen dilution of silane". Journal of Non-Crystalline Solids 299-302 (2002) 487-491.*

Guo, L., et al.; "Low-Temperature Growth of Crystalline Silicon on a Chlorine-Terminated Surface"; Applied Physics Letters, AIP, American Institute of Physics; vol. 75, No. 22; Nov. 29, 1999; pp. 3515-3517; XP012024165.

Nishimoto, T., et al; "Effect of Halogen Additives on the Stability of a-Si: H Films Deposited at a High-Growth Rate"; Solar Energy Materials and Solar Cells, Elsevier Science Publishers; vol. 66, No. 1-4; Feb. 1, 2001; pp. 179-185; XP004224673.

Han, D., et al: "Hydrogen Structures and he Optoelectronic Properties in Transition Films from Amorphous to Microcrystalline Silicon Prepared by Hot-Wire Chemical Vapor Deposition"; Journal of Applied Physics; vol. 93, No. 7; Apr. 1, 2003; pp. 3776-3783; XP012059306.

Platz, R., et al.; "Intrinsic Microcrystalline Silicon by Plasma-Enhanced Chemical Vapor Deposition from Dichlorosilane"; Applied Physics Letters; Aug. 31, 1998; vol. 73, No. 9; pp. 1236-1238.

Nakamura, N., et al; "The Influence of the Si-H2 Bond on the Light-Induced Effect in a-Si Films and a-Si Solar Cells"; Japanese Journal of Applied Physics; vol. 28, No. 10; Oct. 1989; pp. 1762-1768.

Nishimoto, T., et al; "Relationship Between the Photo-Induced Degradation Characteristics and Film Structure of a-Si: H Films Prepared Under Various Conditions"; Thin Film Silicon Solar Cells Superlab.; pp. 876-879, 2000.

Takai, M., et al; "Effect of Higher-Silane Formation on Electron Temperature in a Silane Glow-Discharge Plasma"; Applied Physics Letters; vol. 77, No. 18; Oct. 30, 2000; pp. 2828-2830.

Carlson, D.E., et al; "Amorphus Silicon Solar Cell"; Applied Physics Letters; vol. 28, No. 11; Jun. 1, 1976; pp. 671-673.

Mataras, D.; "Exploration of the Deposition Limits of Microcrystalline Silicon"; Pure Appl. Chem.; vol. 77, No. 2; 2005; pp. 379-389.

Bhattacharya, EN., et al; "Microstructure and the Light-Induced Metastability in Hydrogenated Amorphous Silicon"; Appli. Phys. Lett.; vol. 52, No. 19; May 9, 1988; pp. 1587-1589.

Hammad, A., et al; "PECVD of Hydrogenated Silicon Thin Films from SiH4+H2+Si2H6 Mixtures"; Thin Solid Films 451-452; 2004; pp. 255-258.

Koga, K., et al; "Cluster-Suppressed Plasma Chemical Vapor Deposition Method for High Quality Hydrogenated Amorphous Silicon Films"; Jpan J. Appl. Phys.; vol. 41; 2002; pp. 168-170.

Shimizu, S., et al; "A Highly Stablized Hydrogenated Amorphous Silicon Film Having Very Low Hydrogen Concentration and an Improved Si Bond Network"; Journal of Applied Physics 97; 2005; pp. 033522-1-033522-4.

Daxing, Han, et al.; "Hydrogen Structures and the Optoelectronic Properties in Transition Films from Amorphous to Micro-Crystalline Silicon Prepared by Hot-Wire Chemical Vapor Deposition"; Journal of Applied Physics; vol. 93, No. 7, 2003; pp. 3775-3783.

* cited by examiner

*Primary Examiner* — Bret Chen
(74) *Attorney, Agent, or Firm* — Lina Yang

(57) ABSTRACT

Chemical additives are used to increase the rate of deposition for the amorphous silicon film (αSi:H) and/or the microcrystalline silicon film (μCSi:H). The electrical current is improved to generate solar grade films as photoconductive films used in the manufacturing of Thin Film based Photovoltaic (TFPV) devices.

13 Claims, 6 Drawing Sheets

ADDITIVES TO SILANE FOR THIN FILM SILICON PHOTOVOLTAIC DEVICES

STATEMENT REGARDING FEDERALLY SPONSORED RESEARCH OF DEVELOPMENT

This invention was made at least in part with funding with the United States Department of Energy under DOE Cooperative Agreement No. DE-EE0000580. The United States Government has certain rights in this invention.

BACKGROUND OF THE INVENTION

Photovoltaic devices (PV) or solar cells are devices which convert sunlight into direct current (DC) electrical power.

Thin Film based Photovoltaic (TFPV) devices have been using both amorphous silicon film ($\alpha$Si:H) and microcrystalline silicon film ($\mu$CSi:H) for low cost thin film photovoltaic devices. Hydrogenated amorphous silicon ($\alpha$Si:H) has been studied for applications in solar cells for several decades. More recently, microcrystalline silicon ($\mu$CSi:H) has been studied because it is a suitable material for the intrinsic layer in the bottom cell of thin-film tandem solar cells.

The deposition of $\alpha$Si:H and $\mu$CSi:H on large substrate based photovoltaic (PV) panels has been accomplished primarily using silane ($SiH_4$) and hydrogen gases ($H_2$) mixtures. The work have been done in the field includes: US2009/0077805 A1, US2007/0298590 A1), U.S. Pat. No. 6,855,621 B2 and JP2005244037. A. Hammad et al (Thin Solid Films 451-452 (2004) 255-258) studied the hydrogenated microcrystalline silicon thin films using silane ($SiH_4$), hydrogen gases ($H_2$) and disilane ($Si_2H_6$).

However, the deposition processes are relatively slow (5 Å/sec for $\alpha$Si:H and 1-7 Å/sec for $\mu$CSi:H) creating a bottle neck in the manufacturing of TFPV panels. This leads to a lower process tool through-put, which in turn leads to higher cost per Watt for the manufactured panels.

Additionally, deposition of $\alpha$Si:H and $\mu$CSi:H on large substrate based photovoltaic (PV) panels with the existing chemistry of $SiH_4$ and $H_2$ yield solar cells with effiClenCles ranging from 6% to 10%, depending, on cell design. The cell effiClency is dependent upon the quality of the $\alpha$Si:H and $\mu$CSi:H deposited, and more speClfically related to the grain size of crystallites in $\mu$CSi:H, number of defects and donor impurities present in the film.

Therefore, there is a need of a method for depositing an amorphous silicon film ($\alpha$Si:H) and a microcrystalline silicon film ($\mu$CSi:H) with increased deposition rate and increased cell effiClency.

BRIEF SUMMARY OF THE INVENTION

Accordingly, the present invention is directed to the use of chemical additives to increase the rate of deposition processes, and improve the electrical current generating capability of the deposited films for photoconductive films used in the manufacturing of Thin Film based Photovoltaic (TFPV) devices.

In one embodiment, the invention provides a method of deposition for a solar grade amorphous silicon film ($\alpha$Si:H) as a photoconductive film on a substrate, using Silane;
hydrogen; and
at least one additive selected from the group consisting of:
(a) higher order straight chain silanes, comprising; disilane $Si_2H_6$, trisilane $Si_3H_8$, tetrasilane $Si_4H_{10}$, pentasilane $Si_5H_{12}$, hexasilane $Si_6H_{14}$, heptasilane $Si_7H_{16}$, octasilane $Si_8H_{18}$, nonasilane $Si_9H_{20}$, decasilane $Si_{10}H_{22}$ and mixtures thereof;
(b) higher order branched silanes, comprising; 2-silyl-trisilane $SiH_3$—$Si(H)(SiH_3)$—$SiH_3$, 2,2-disilyl-trisilane $SiH_3$—$Si(SiH_3)_2$—$SiH_3$, 2-silyl-tetrasilane $SiH_3$—$Si(H)(SiH_3)$—$SiH_2$—$SiH_3$, 2,3-disilyltetrasilane $SiH_3$—$SiH(SiH_3)$—$SiH(SiH_3)$—$SiH_3$, 2,2-disilyltetrasilane $SiH_3$—$Si(SiH_3)_2$—$SiH_2$—$SiH_3$, 3-silylpentasilane $SiH_3$—$SiH_2$—$SiH(SiH_3)$—$SiH_2$—$SiH_3$, 2-silylpentasilane $SiH_3$—$SiH(SiH_3)$—$SiH_2$—$SiH_2$—$SiH_3$, 2,3-disilylpentasilane $SiH_3$—$SiH(SiH_3)$—$SiH(SiH_3)$—$SiH_2$—$SiH_3$, 2,4-disilylpentasilane $SiH_3$—$SiH(SiH_3)$—$SiH_2$—$SiH(SiH_3)$—$SiH_3$, 2-silylhexasilane $SiH_3$—$SiH(SiH_3)$—$(SiH_2)_3SiH_3$, 3-silylhexasilane $SiH_3$—$SiH_2$—$SiH(SiH_3)$—$(SIH_2)_2SiH_3$, 2,2-disilylpentasilane $SiH_3$—$Si(SiH_3)_2$—$(SiH_2)_2$—$SiH_3$, 3,3-disilylpentasilane $SiH_3$—$SiH_2$—$Si(SiH_3)_2SiH_2SiH_3$ 2,2,3-trisilyltetrasilane $SiH_3$—$Si(SiH_3)_2$—$SiH(SiH_3)$—$SiH_3$, 2-silylheptasilane $SiH_3$—$SiH(SiH_3)$—$(SiH_2)_4$—$SiH_3$, 3-silylheptasilane $SiH_3$—$SiH_2$—$SiH(SiH_3)$—$(SiH_2)_3$—$SiH_3$, 4-silylheptasilane $SiH_3$—$(SiH_2)_2$—$SiH(SiH_3)$—$(SiH_2)_2$—$SiH_3$, 2,2-disilylhexasilane $SiH_3$—$Si(SiH_3)_2$—$(SiH_2)_3$—$SiH_3$, 2,3-disilylhexasilane $SiH_3$—$SiH(SiH_3)$—$SiH(SiH_3)$—$(SiH_2)_2$—$SiH_3$, 2,4-disilylhexasilane $SiH_3$—$SiH(SiH_3)$—$SiH_2$—$SiH(SiH_3)$—$SiH_2$—$SiH_3$, 2,5-disilylhexasilane $SiH_3$—$SiH(SiH_3)$—$(SiH_2)_2$—$SiH(SiH_3)$—$SiH_3$, 3,3-disilylhexasilane $SiH_3$—$SiH_2$—$Si(SiH_3)_2$—$(SiH_2)_2$—$SiH_3$, 3,4- disilylhexasilane $SiH_3$—$SiH_2$—$SiH(SiH_3)$—$SiH(SiH_3)$—$SiH_2$—$SiH_3$, 2,2,3-trisilylpentasilane $SiH_3$—$Si(SiH_3)_2$—$SiH(SiH_3)$—$SiH_2$—$SiH_3$, 2,2,4-trisilylpentasilane $SiH_3$—$Si(SiH_3)_2$—$SiH_2$—$SiH(SiH_3)$—$SiH_3$, 2,3,3-trisilylpentasilane $SiH_3$—$SiH(SiH_3)$—$Si(SiH_3)_2$—$SiH_2$—$SiH_3$, 2,3,4-trisilylpentasilane $SiH_3$—$SiH(SiH_3)$—$SiH(SiH_3)$—$SiH(SiH_3)$—$SiH_3$, 2,2,3,3-tetrasilyltetrasilane $SiH_3$—$Si(SiH_3)_2$—$Si(SiH_3)_2$—$SiH_3$ and mixtures thereof;
(c) cyclic silanes, selected from the group consisting of; cyclotrisilane $Si_3H_6$, cyclotetrasilane $Si_4H_8$, cyclopentasilane $Si_5H_{10}$, cyclohexasilane $Si_6H_{10}$, and mixtures thereof;
(d) silyl substituted cyclic silanes, selected from the group consisting of; silyl cyclotetrasilane $SiH3$—$Si_4H_7$, 1,2-disilylcyclopentasilane $(SiH_3)_2$—$Si_5H_8$, silyl cyclohexasilane $SiH_3$—$Si_6H_{11}$, 1,3-disilyl cyclohexasilane $(SiH_3)_2$—$Si_6H_{10}$, and mixtures thereof;
(e) silyl substituted silanes, selected from the group consisting of; 2-tetrasilane $SiH_3$—$SiH$=$SiH$—$SiH_3$, 2,3-disilyltetrasil-2-ene $SiH_3$-$Si(SiH_3)$=$Si(SiH_3)$—$SiH_3$, 2,3-disilylpentasil-2-ene $SiH_3$—$Si(SiH_3)$=$Si(SiH_3)$—$SiH_2$—$SiH_3$, 2,5-disilylhexasil-2-ene $SiH_3$—$Si(SiH_3)$=$SiH$—$SiH2$—$SiH(SiH_3)$—$SiH_3$, 2,3,4-trisilylhexasil-2-ene $SiH_3$—$Si(SiH_3)$=$Si(SiH_3)$—$SiH(SiH_3)$—$SiH_2$—$SiH_3$, and mixtures thereof;
(f) halogen substituted silanes, including; 1,1-dichlordisilane $SiHCl_2SiH_3$, 1,1,1,2-tetrafluorodislane $SiF_3$—$SiH_2F$, 1,2-dichloro-1,2-difluorotetrasilane $SiHClF$—$SiClF$—$SiH_2$—$SiH_3$, 1,1,1-trichlorotrisilane $SiCl_3$—$SiH_2$—$SiH_3$, 1,1-difluoro-1,2,2-trichlorosilane $SiF_2Cl$—$SiCl_2$—$SiH_3$, chloropentasilane $SiH_2Cl$—$(SiH_2)_3$—$SiH_3$, and other compounds of the general formula $Si_wH_{2w+2-z}X_z$ where X=F, Cl, Br, I; w can be 1 to 20 and z can be 1 to 2w+2; 2-chlorotetrasil-2-ene $SiH_3$—$SiCl$=$SiH$—$SiH_3$, 1,1-dichloro-2-fluoropentasil-2-ene $SiHCl_2$—$SiF$=$SiH_2$—$SiH_2$—$SiH_3$, 2,3-dichlorotetrasil-2-ene $SiH_3$—$SiCl$=$SiCl$—$SiH_3$, and other compounds of the general formula $Si_wH_{2w-z}X'_z$ where $X'$=F, Cl, Br, I; and, w can be 2 to 20 and z can be 1 to 2w; and mixtures thereof; and (g) halogen substituted cyclic silanes, selected from the group consisting of; chlorocyclopentasilane $Si_5H_9Cl$, dodecachlorocyclohexasilane $Si_6Cl_{12}$, 1-chloro-1fluorocyclopentasilane $Si_5H_8FCl$, and mixtures thereof;

and the deposited solar grade amorphous silicon film ($\alpha Si:H$) thereof.

In another embodiment, the invention provides a method of deposition for amorphous silicon film ($\alpha Si:H$) or microcrystalline silicon film ($\mu CSi:H$) as a photoconductive film on a substrate, using Silane;

hydrogen;

at least one additive selected from the group consisting of:

(a) higher order straight chain silanes, comprising; disilane $Si_2H_6$, trisilane $Si_3H_8$, tetrasilane $Si_4H_{10}$, pentasilane $Si_5H_{12}$, hexasilane $Si_6H_{14}$, heptasilane $Si_7H_{16}$, octasilane $Si_8H_{18}$, nonasilane $Si_9H_{20}$, decasilane $Si_{10}H_{22}$ and mixtures thereof;

(b) higher order branched silanes, comprising; 2-silyltrisilane $SiH_3$—$Si(H)(SiH_3)$—$SiH_3$, 2,2-disilyl-trisilane $SiH_3$—$Si(SiH_3)_2$—$SiH_3$, 2-silyl-tetrasilane $SiH_3$—$Si(H)(SiH_3)$—$SiH_2$—$SiH_3$, 2,3-disilyltetrasilane $SiH_3$—$SiH(SiH_3)$—$SiH(SiH_3)$—$SiH_3$, 2,2-disilyltetrasilane $SiH_3$—$Si(SiH_3)_2$—$SiH_2$—$SiH_3$, 3-silylpentasilane $SiH_3$—$SiH_2$—$SiH(SiH_3)$—$SiH_2$—$SiH_3$, 2-silylpentasilane $SiH_3$—$SiH(SiH_3)$—$SiH_2$—$SiH_2$—$SiH_3$, 2,3-disilylpentasilane $SiH_3$—$SiH(SiH_3)$—$SiH(SiH_3)$—$SiH_2$—$SiH_3$, 2,4-disilylpentasilane $SiH_3$—$SiH(SiH_3)$—$SiH_2$—$SiH(SiH_3)$—$SiH_3$, 2-silylhexasilane $SiH_3$—$SiH(SiH_3)$—$(SiH_2)_3SiH_3$, 3-silylhexasilane $SiH_3$—$SiH_2$—$SiH(SiH_3)$—$(SiH_2)_2SiH_3$, 2,2-disilylpentasilane $SiH_3$—$Si(SiH_3)_2$—$(SiH_2)_2$—$SiH_3$, 3,3-disilylpentasilane $SiH_3$—$SiH_2$—$Si(SiH_3)_2$—$SiH_2$—$SiH_3$, 2,2,3-trisilyltetrasilane $SiH_3$—$Si(SiH_3)_2$—$SiH(SiH_3)$—$SiH_3$, 2-silylheptasilane $SiH_3$—$SiH(SiH_3)$—$(SiH_2)_4$—$SiH_3$, 3-silylheptasilane $SiH_3$—$SiH_2$—$SiH(SiH_3)$—$(SiH_2)_3$—$SiH_3$, 4-silylheptasilane $SiH_3$—$(SiH_2)_2$—$SiH(SiH_3)$—$(SiH_2)_2$—$SiH_3$, 2,2-disilylhexasilane $SiH_3$—$Si(SiH_3)_2$—$(SiH_2)_3$—$SiH_3$, 2,3-disilylhexasilane $SiH_3$—$SiH(SiH_3)$—$SiH(SiH_3)$—$(SiH_2)_2$—$SiH_3$, 2,4-disilylhexasilane $SiH_3$—$SiH(SiH_3)$—$SiH_2$—$SiH(SiH_3)$—$SiH_2$—$SiH_3$, 2,5-disilylhexasilane $SiH_3$—$SiH(SiH_3)$—$(SiH_2)_2$—$SiH(SiH_3)$—$SiH_3$, 3,3-disilylhexasilane $SiH_3$—$SiH_2$—$Si(SiH_3)_2$—$(SiH_2)_2$—$SiH_3$, 3,4-disilylhexasilane $SiH_3$—$SiH_2$—$SiH(SiH_3)$—$SiH(SiH_3)$—$SiH_2$—$SiH_3$, 2,2,3-trisilylpentasilane $SiH_3$—$Si(SiH_3)_2$—$SiH(SiH_3)$—$SiH_2$—$SiH_3$, 2,2,4-trisilylpentasilane $SiH_3$—$Si(SiH_3)_2$—$SiH_2$—$SiH(SiH_3)$—$SiH_3$, 2,3,3-trisilylpentasilane $SiH_3$—$SiH(SiH_3)$—$Si(SiH_3)_2$—$SiH_2$—$SiH_3$, 2,3,4-trisilylpentasilane $SiH_3$—$SiH(SiH_3)$—$SiH(SiH_3)$—$SiH(SiH_3)$—$SiH_3$, 2,2,3,3-tetrasilyltetrasilane $SiH_3$—$Si(SiH_3)_2$—$Si(SiH_3)_2$—$SiH_3$ and mixtures thereof;

(c) cyclic silanes, selected from the group consisting of; cyclotrisilane $Si_3H_6$, cyclotetrasilane $Si_4H_8$, cyclopentasilane $Si_5H_{10}$, cyclohexasilane $Si_6H_{10}$, and mixtures thereof;

(d) silyl substituted cyclic silanes, selected from the group consisting of; silyl cyclotetrasilane $SiH3$-$Si_4H_7$, 1,2-disilyl cyclopentasilane $(SiH_3)_2$—$Si_5H_8$, silyl cyclohexasilane $SiH_3$—$Si_6H_{11}$, 1,3-disilyl cyclohexasilane $(SiH_3)_2$—$Si_6H_{10}$, and mixtures thereof;

(e) silyl substituted silanes, selected from the group consisting of; 2-tetrasilane $SiH_3$—$SiH$=$SiH$—$SiH_3$, 2,3-disilyltetrasil-2-ene $SiH_3$—$Si(SiH_3)$=$Si(SiH_3)$—$SiH_3$, 2,3-disilylpentasil-2-ene $SiH_3$—$Si(SiH_3)$=$Si(SiH_3)$—$SiH_2$—$SiH_3$, 2,5-disilylhexasil-2-ene $SiH_3$—$Si(SiH_3)$=$SiH$-$SiH2$—$SiH(SiH_3)$—$SiH_3$, 2,3,4-trisilylhexasil-2-ene $SiH_3$—$Si(SiH_3)$=$Si(SiH_3)$—$SiH(SiH_3)$—$SiH_2$—$SiH_3$, and mixtures thereof;

and at least one another additive selected from the group consisting of:

(f) halogen substituted silanes, selected from the group consisting of; monochlorosilane $SiH_3Cl$, dichlorosilane $SiH_2Cl_2$, trichlorosilane $SiHCl_3$, tetrachlorosilane ($SiCl_4$), chlorodisilane $SiH_3$—$SiH_2Cl$, and mixtures thereof; and (g) halogen containing gases, selected from the group consisting of; chlorine $Cl_2$, hydrogen chloride HCl, chlorine trifluoride $ClF_3$, nitrogen trifluoride $NF_3$, fluorine $F_2$, hydrogen fluoride HF, bromine $Br_2$, hydrogen bromide HBr, hydrogen iodide HI and mixtures thereof;

and the deposited amorphous silicon film ($\alpha Si:H$) or microcrystalline silicon film ($\mu CSi:H$) thereof.

In yet another embodiment, the invention provides a method of deposition for a solar grade amorphous silicon film ($\alpha Si:H$) or a microcrystalline silicon film ($\mu CSi:H$) having high microcrystalline fraction as a photoconductive film on a substrate, using Silane;

hydrogen; and at least one additive selected from the group consisting of:

(a) halogen substituted higher order silanes, including; 1,1-dichlordisilane $SiHCl_2SiH_3$, 1,1,1,2-tetrafluorodislane $SiF_3$—$SiH_2F$, 1,2-dichloro-1,2-difluorotetrasilane $SiHClF$—$SiClF$—$SiH_2$—$SiH_3$, 1,1,1-trichlorotrisilane $SiCl_3$—$SiH_2$—$SiH_3$, 1,1-difluoro-1,2,2-trichlorosilane $SiF_2Cl$-$SiCl_2$—$SiH_3$, chloropentasilane $SiH_2Cl$—$(SiH_2)_3$—$SiH_3$, and other compounds of the general formula $Si_wH_{2w+2-z}X_z$ where $X$ =F, Cl, Br, I; w can be 1 to 20 and z can be 1 to 2w+2; 2-chlorotetrasil-2-ene $SiH_3$—$SiCl$=$SiH$—$Si H_3$, 1,1-dichloro-2-fluoropentasil-2-ene $SiHCl_2$—$SiF$=$SiH_2$—$SiH_2$—$SiH_3$, 2,3-dichlorotetrasil-2-ene $SiH_3$—$SiCl$=$SiCl$—$SiH_3$, and other compounds of the general formula $Si_wH_{2w-z}X'_z$ where $X'$=F, Cl, Br, I; and, w can be 2 to 20 and z can be 1 to 2w; and mixtures thereof; and (b) halogen substituted cyclic higher order silanes, selected from the group consisting of; chlorocyclopentasilane $Si_5H_9Cl$, dodecachlorocyclohexasilane $Si_6Cl_{12}$, 1-chloro-1fluorocyclopentasilane $Si_5H_8FCl$, and mixtures thereof.

and the deposited solar grade amorphous silicon film ($\alpha Si:H$) or microcrystalline silicon film ($\mu CSi:H$) having high microcrystalline fraction thereof.

The deposited films in the embodiments disclosed above, provide high deposition rates, enhanced photoconductivity, solar grade for amorphous silicon film (αSi:H), and high microcrystalline fraction for microcrystalline silicon film (μCSi:H).

DETAILED DESCRIPTION OF THE INVENTION

Figure 1:
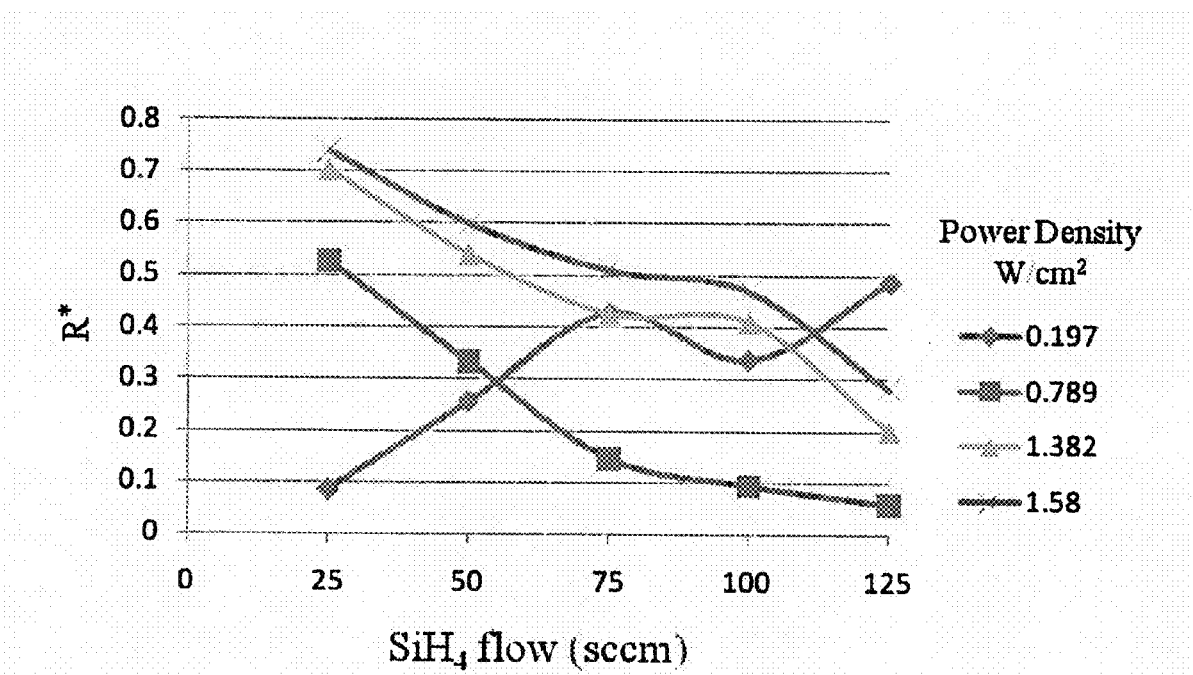
FIG. 1. The Empirical Microstructure Factor R* of hydrogenated silicon αSi:H versus $SiH_4$ flow rate under different power densities. The hydrogenated silicon αSi:H was deposited using silane and hydrogen.

In prior arts, Plasma power, frequency, temperature, gas mixing ratios and pressure have been used to control film structure, thickness and electrical properties.

The present invention further discloses the use of chemical additives to increase the rate of deposition processes, and improve the electrical current generating capability of the deposited films for photoconductive films used in the manufacturing of Thin Film based Photovoltaic (TFPV) devices.

Increasing the module effiClency is one approach for reduClng manufacturing costs. The present invention discloses the reduction of manufacturing costs through the addition of additives to the mixture of $SiH_4$ and $H_2$.

In present invention, the additives are used to increase the deposition rate, and in addition, to control film structure to achieve the better grade for the practical use, to optimize crystalline grain sizes, reduce the number of defects and/or minimize or neutralize the effects of impurities present as a result of contamination, from the processing environment; thus to reduce manufacturing costs.

More speClfically, the present invention uses the mixture of silane and hydrogen as the primary source of silicon, and uses additives as the process enhanClng feature. The process enhancements are significantly greater than the potential additional cost afforded by the use of higher value additives. These enhancements lead to a lower cost per unit of energy through: (i) a faster deposition rate and better controlling of film grade resulting, from the addition of relatively low mole fractions of higher order silanes; and, (ii) more photoconductive film through the addition of a halogen containing gas or a halogen substituted silane containing gas.

The deposition processes include but not limited to Chemical Vapor Deposition (CVD), Plasma Enhanced Chemical Vapor Deposition (PECVD), Low Pressure Chemical Vapor Deposition (LPCVD), Hot Wire Chemical Vapor Deposition (HWCVD), Initiated Chemical Vapor Deposition (ICVD) and Sub Atmospheric Chemical Vapor Deposition (SACVD).

Process enhanClng additives include, but not limited to (a) Higher order straight chain silanes, including; disilane $Si_2H_6$, trisilane $Si_3H_8$, tetrasilane $Si_4H_{10}$, pentasilane $Si_5H_{12}$, hexasilane $Si_6H_{14}$, heptasilane $Si_7H_{16}$, octasilane $Si_8H_{18}$, nonasilane $Si_9H_{20}$, decasilane $Si_{10}H_{22}$ and other straight chain silanes following the general formula $Si_xH_{2x+2}$ where can be 2-20;

(b) Higher order branched silanes including; 2-silyl-trisilane $SiH_3$—$Si(H)(SiH_3)$—$SiH_3$, 2,2-disilyl-trisilane $SiH_3$—$Si(SiH_3)_2$—$SiH_3$, 2-silyl-tetrasilane $SiH_3$—$Si(H)(SiH_3)$—$SiH_2$—$SiH_3$, 2,3-disilyltetrasilane $SiH_3$—$SiH(SiH_3)$—$SiH(SiH_3)$—$SiH_3$,2,2-disilyltetrasilane $SiH_3$—$Si(SiH_3)_2$—$SiH_2$—$SiH_3$, 3-silylpentasilane $SiH_3$—$SiH_2$—$SiH(SiH_3)$—$SiH_2$—$SiH_3$,2-silylpentasilane $SiH_3$—$SiH(SiH_3)$—$SiH_2$—$SiH_2$—$SiH_3$ 2,3-disilylpentasilane $SiH_3SiH(SiH_3)$—$SiH(SiH_3)$—$SiH_2$—$SiH_3$, 2,4-disilylpentasilane $SiH_3$—$SiH(SiH_3)$—$SiH_2$—$SiH(SiH_3)$—$SiH_3$, 2-silyhexasilane $SiH_3$—$SiH(SiH_3)$—$(SiH_2)_3SiH_3$, 3-silyhexasilane $SiH_3$—$SiH_2$—$SiH(SiH_3)$—$(SiH_2)_2SiH_3$, 2,2-disilylpentasilane $SiH_3$—$Si(SiH_3)_2$—$(SiH_2)_2$—$SiH_3$, 3,3-disilylpentasilane $SiH_3$—$SiH_2$—$Si(SiH_3)_2$—$SiH_2$—$SiH_3$, 2,2,3-trisilyltetrasilane $SiH_3$—$Si(SiH_3)_2$—$SiH(SiH_3)$—$SiH_3$, 2-silylheptasilane $SiH_3$—$SiH(SiH_3)$—$(SiH_2)_4$—$SiH_3$, 3-silylheptasilane $SiH_3$—$SiH_2$—$SiH(SiH_3)$—$(SiH_2)_3$—$SiH_3$, 4-silylheptasilane $SiH_3$—$(SiH_2)_2$—$SiH(SiH_3)$—$(SiH_2)_2$—$SiH_3$, 2,2-disilylhexasilane $SiH_3$—$Si(SiH_3)_2$—$(SiH_2)_3$—$SiH_3$, 2,3-disilylhexasilane $SiH_3$—$SiH(SiH_3)$—$SiH(SiH_3)$—$(SiH_2)_2$—$SiH_3$, 2,4-disilylhexasilane $SiH_3$—$SiH(SiH_3)$—$SiH_2$—$SiH(SiH_3)$—$SiH_2$—$SiH_3$, 2,5-disilylhexasilane $SiH_3$—$SiH(SiH_3)$—$(SiH_2)_2$—$SiH(SiH_3)$—$SiH_3$, 3,3-disilylhexasilane $SiH_3$—$SiH_2$—$Si(SiH_3)_2$—$(SiH_2)_2$—$SiH_3$, 3,4-disilylhexasilane $SiH_3$—$SiH_2$—$SiH(SiH_3)$—$SiH(SiH_3)$—$SiH_2$—$SiH_3$, 2,2,3-trisilylpentasilane $SiH_3$—$Si(SiH_3)_2$—$SiH(SiH_3)$—$SiH_2$—$SiH_3$, 2,2,4-trisilylpentasilane $SiH_3$—$Si(SiH_3)_2$—$SiH_2$—$SiH(SiH_3)$—$SiH_3$, 2,3,3-trisilylpentasilane $SiH_3$—$SiH(SiH_3)$—$Si(SiH_3)_2$—$SiH_2$—$SiH_3$, 2,3,4-trisilylpentasilane $SiH_3$—$SiH(SiH_3)$—$SiH(SiH_3)$—$SiH(SiH_3)$—$SiH_3$, 2,2,3,3-tetrasilyltetrasilane $SiH_3$—$Si(SiH_3)_2$—$Si(SiH_3)_2$—$SiH_3$ and any other higher branched silanes under the general formula $Si_xH_{2x+2}$ where x can be 4-20;

(c) Cyclic silanes, including; cyclotrisilane $Si_3H_6$, cyclotetrasilane $Si_4H_8$, cyclopentasilane $Si_5H_{10}$, cyclohexasilane $Si_6H_{10}$, and other cyclic silanes consisting of the general formula $Si_xH_{2x}$ where x can be 3-20;

(d) Silyl substituted cyclic silanes, including; silyl cyclotetrasilane $SiH3$-$Si_4H_7$, 1,2-disilyl cyclopentasilane $(SiH_3)_2$—$Si_5H_8$, cyclohexasilane $SiH_3$—$Si_6H_{11}$, 1,3-disilyl cyclohexasilane $(SiH_3)_2$—$Si_6H_{10}$, and other silyl substituted cyclosilanes of the general formula $Si_yH_{3y}$—$Si_xH_{2x-y}$ where x can be 3 to 20 and y can be 1 to 2x.

(e) Silyl substituted silanes, including; 2-tetrasilane $SiH_3$—$SiH$=$SiH$—$SiH_3$, 2,3-disilyltetrasil-2-ene $SiH_3$—$Si(SiH_3)$=$Si(SiH_3)$—$SiH_3$, 2,3-disilylpentasil-2-ene $SiH_3$—$Si(SiH_3)$=$Si(SiH_3)$—$SiH_2$—$SiH_3$, 2,5-disilylhexasil-2-ene $SiH_3$—$Si(SiH_3)$=$SiH$—$SiH2$—$SiH(SiH_3)$—$SiH_3$, 2,3,4-trisilylhexasil-2-ene $SiH_3$—$Si(SiH_3)$=$Si(SiH_3)$—$SiH(SiH_3)$—$SiH_2$—$SiH_3$, and other silyl substituted silanes of the general formula $Si_yH_{3y}$—$Si_xH_{2x-(y+2)}$ where x can be 2-20 and y can be 1 to 2x.

(f) Halogen substituted higher order silanes, including; 1,1-dichlordisilane $SiHCl_2SiH_3$, 1,1,1,2-tetrafluorodislane $SiF_3$—$SiH_2F$, 1,2-dichloro-1,2-difluorotetrasilane $SiHClF$—$SiClF$—$SiH_2$—$SiH_3$, 1,1,1-trichlorotrisilane $SiCl_3$—$SiH_2$—$SiH_3$, 1,1-difluoro-1,2,2-trichlorosilane $SiF_2Cl$—$SiCl_2$—

$SiH_3$, chloropentasilane $SiH_2Cl—(SiH_2)_3—SiH_3$, and other compounds of the general formula $Si_wH_{2w+2-z}X_z$ where X=F, Cl, Br, I; where w can be 1 to 20 and z can be 1 to 2w+2; 2-chlorotetrasil-2-ene $SiH_3$-$SiCl=SiH—SiH_3$, 1,1-dichloro-2-fluoropentasil-2-ene $SiHCl_2—SiF=SiH_2—SiH_2—SiH_3$, 2,3-dichlorotetrasil-2-ene $SiH_3—SiCl=SiCl—SiH_3$, and other compounds of the general formula $Si_wH_{2w-z}X'_z$ where X' =F, Cl, Br, I; and, w can be 2 to 20 and z can be 1 to 2w.

(g) Halogen substituted cyclic higher order silanes, including; chlorocyclopentasilane $Si_5H_9Cl$, dodecachlorocyclohexasilane $Si_6Cl_{12}$, 1-chloro-1fluorocyclopentasilane $Si_5H_8FCl$, and other cyclic silanes of the general formula $Si_wH_{2w-zz}X'_z$ where X'=F, Cl, Br, I; where w can be 3 to 20 and z can be 1 to 2w.

(h) Halogen substituted silanes, including; monochlorosilane $SiH_3Cl$, dichlorosilane $SiH_2Cl_2$, trichlorosilane $SiHCl_3$, tetrachlorosilane ($SiCl_4$), and chlorodisilane $SiH_3—SiH_2Cl$.

(i) Halogen containing gases, including; chlorine $Cl_2$, hydrogen chloride HCl, chlorine trifluoride $ClF_3$, nitrogen trifluoride $NF_3$, fluorine $F_2$, hydrogen fluoride HF, bromine $Br_2$, hydrogen bromide HBr, hydrogen iodide HI and other compounds of these types.

To increase the deposition rate and improve the photoconductivity of the film, one embodiment of the present invention uses at least one additive selected from the groups (a) to (g) shown above in addition of $SiH_4$ and $H_2$; yet another embodiment of the present invention uses the combinations of additives from groups (a) to (e) and additives from groups (h) and (i) to further enhance the photoconductivity of the film.

The depositions use 5 to 10% silane; from 0.01 to 5% an additive from groups (a) to (g); 0.01 to 5% an additive from groups (h) and (i), and the rest is hydrogen, where, the flow of hydrogen, silane, an appropriate additive or additives totals 100%.

Working Examples

Deposition of Amorphous Silicon Film ($\alpha$Si:H)

Hydrogen plays a critical role in the properties and formation of hydrogenated silicon (Si:H) networks. Examples of this would be in the metastability of the optoelectronic properties in amorphous hydrogenated silicon which is also known as the Staebler-Wronski Effect (SWE). Another example would be in the crystallization of Si—Si bonds during microcrystalline Si:H growth.

Infrared (IR) spectroscopy is a commonly applied analytical technique used to detect the different bending, wagging, and stretching modes (SM) of hydrides in amorphous hydrogenated and microcrystalline silicon. In the bulk layer of amorphous hydrogenated silicon there are three characteristic absorptions modes; wagging modes at 640 $cm^{-1}$, a sClssors doublet or bending mode at 840-890 $cm^{-1}$ which is assigned to the di-hyrides, and the stretching modes in the range of 1895-2130 $cm^{-1}$. The stretching modes are of great interest due to the fact that they reflect detailed information related to the bonding environment of hydrogen in the film.

It is well understood that by using IR to analyze amorphous hydrogenated silicon for the Si—$H_x$ stretching modes between 1895-2130 $cm^{-1}$ one can back out ratios of Si—$H_2$ which is also called the High Stretching Mode (HSM) at 2070-2100 $cm^{-1}$ and Si—H which is also call the Low Stretching Mode (LSM) at 1980-2010 $cm^{-1}$. Amorphous hydrogenated silicon intrinsic, layers with inferior opto-electronic properties typically are dominated by Si—$H_2$ stretching modes.

The Empirical Microstructure Factor (R*) is a calculation where one can back out ratios of HSM and LSM. The Empirical Microstructure Factor is defined as $R^* = I_{HSM}/(I_{LSM} + I_{HSM})$ where $I_{HSM}$ and $I_{LSM}$ correspond to the integrated absorption strength of the LSM and HSM. By definition, the R* value is the percent Si—$H_2$ in the film. The smaller the R* value is, the less percent of Si—$H_2$ is in the film. In general for amorphous hydrogenated silicon to be classified as solar grade material you need R*<0.2, or less than 20%.

Plasma Enhanced Chemical Vapor Deposition (PECVD) was used in the present invention to deposit thin films of $\alpha$Si:H for single junction solar cells and $\alpha$Si:H and $\mu$CSi:H for tandem solar cells, using silane with hydrogen and additives.

Deposition of Amorphous Silicon Film ($\alpha$Si:H)

The Empirical Microstructure Factor (R*) in amorphous hydrogenated silicon intrinsic layers produced by using Silane ($SiH_4$) and hydrogen can be manipulated by changing the total flow of chemical by volume and power density in a Plasma Enhanced Chemical Vapor Deposition chamber (PECVD).

Materials used to produce $\alpha$Si:H and $\mu$CSi:H based solar cells include from 5 to 10% silane; from 0.9 to 1.8% of an additive or additives. Process conditions include a substrate temperature of 25°-500° C. with preferred temperatures of 150°-250° C. Process conditions include plasma powers from 10-10,000 watts, power, densities from 019 $W/cm^2$ to 1.6 $W/cm^2$ and chamber pressures from 0.01 torr to 15 torr.

FIG. 1 was a graph showing the Empirical Microstructure Factor R* of hydrogenated silicon $\alpha$Si:H deposited versus $SiH_4$ flow rate under different power densities. The percentage of $SiH_4$ used was 9.0% and $H_2$ was 91%.

The flow rate of the $SiH_4$ ranged from 0 to 125 sccm; and the power densities were at 0.197, 0.789, 1.382 and 1.58 $W/cm^2$.

As the power density increased at lower flow rate range (see the flow rates <50 sccm), the Empirical Microstructure Factors R* tended to be above 20% for all power densities. As the flow rate increased>50 sccm, as power density increased, the Empirical Microstructure Factors R* started to decrease for all power densities, except for 0.197 $W/cm^2$. However, it's interesting to point out that the Empirical Microstructure Factors R* did not get below 20% at higher flow rates (100 and 125 sccm) for all power densities, except at 0.789 $W/cm^2$, which led to the conclusion that these films would not produce a suitable solar grade material.

The added value of produClng the Empirical Microstructure Factors R* below 20% at high power densities and high flow rates was the benefit of increased growth rates of the intrinsic films.

Figure 2:
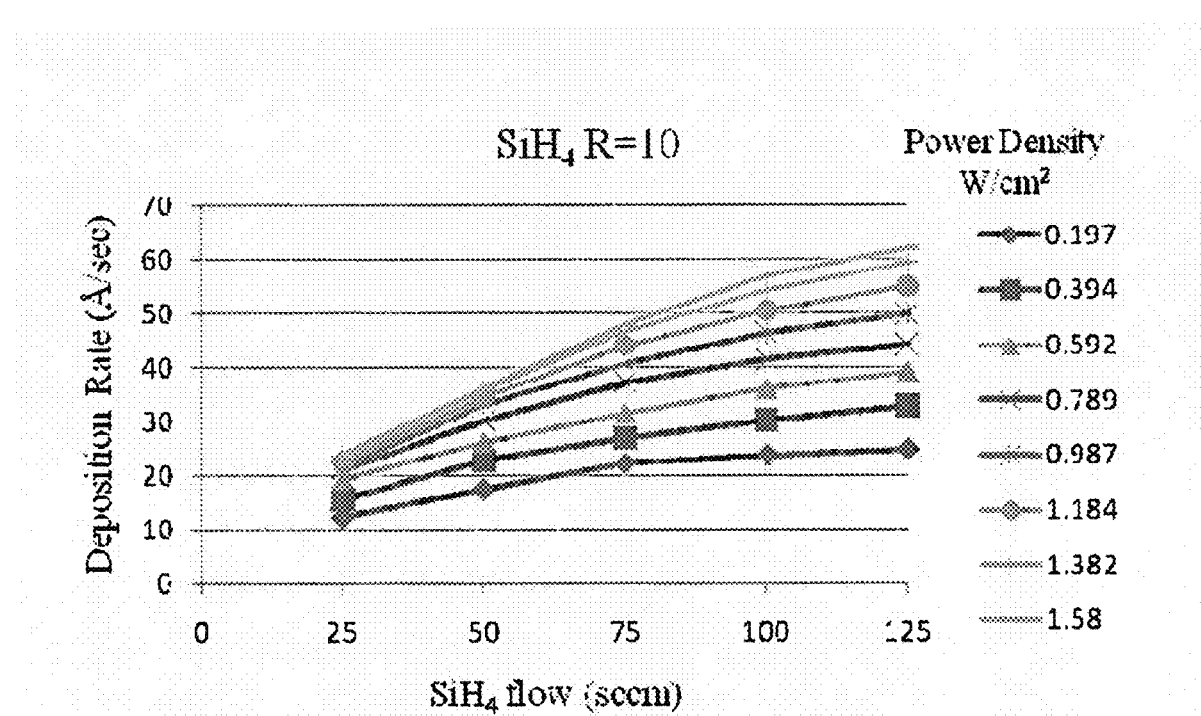
FIG. 2. The deposition rate of hydrogenated silicon αSi:H versus $SiH_4$ flow rate under different power densities. The hydrogenated silicon αSi:H was deposited using silane and hydrogen.

FIG. 2 was a graph showing the deposition (growth) rate versus $SiH_4$ flow rate under different power densities. The Empirical Microstructure Factor R* for the data was at 10%. The percentage of $SiH_4$ used was 9.0% and $H_2$ was 91%. The flow rate of the $SiH_4$ ranged from 0 to 125 sccm; and the power densities were at 0.197, 0.394, 0.592, 0.789, 0.987, 1.184, 1.382 and 1.58 $W/cm^2$.

FIG. 2 showed that as flow rates and power densities increased, the deposition rates also increased.

Disilane was used as the at least one of additives for higher order silanes shown above in group (a). The disilane used ranged from 0.9% to 1.8%.

Figure 3:
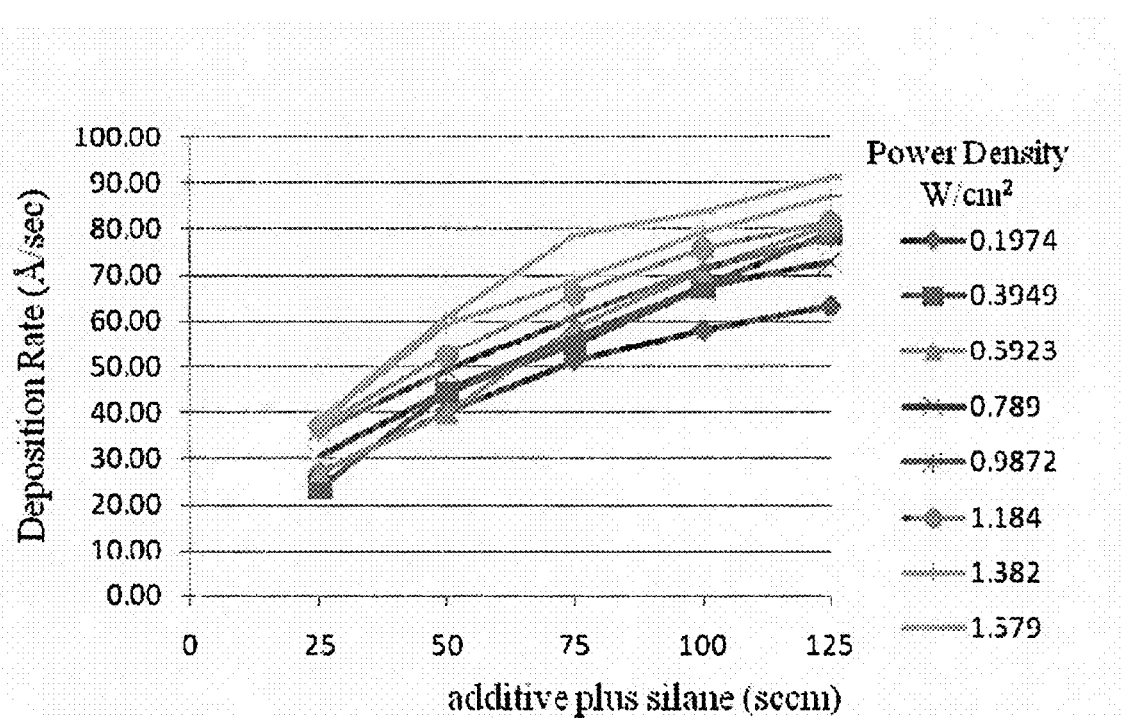
FIG. 3. The deposition rate of hydrogenated silicon αSi:H versus the flow rate of the mixture of SiH4 and disilane under different power densities. The hydrogenated silicon αSi:H was deposited using silane disilane and hydrogen.

The deposition rate versus the flow rate of the mixture of silane with disilane under different power densities had been shown in FIG. 3. The percentage of disilane was 0.9%, silane was 8.1%, and hydrogen was 91%.

The flow rate of the mixture of $SiH_4$ and disilane ranged from 0 to 125 sccm; and the power densities were at 0.197, 0.394, 0.592, 0.789, 0.987, 1.184, 1.382 and 1.58 $W/cm^2$.

By using at least one of these higher order silanes as an additive to silane in the deposition process, the amorphous phase deposition (growth) rate significantly increased as the flow rate increased at all power densities compared to the neat silane films shown in FIG. 2.

Figure 4:
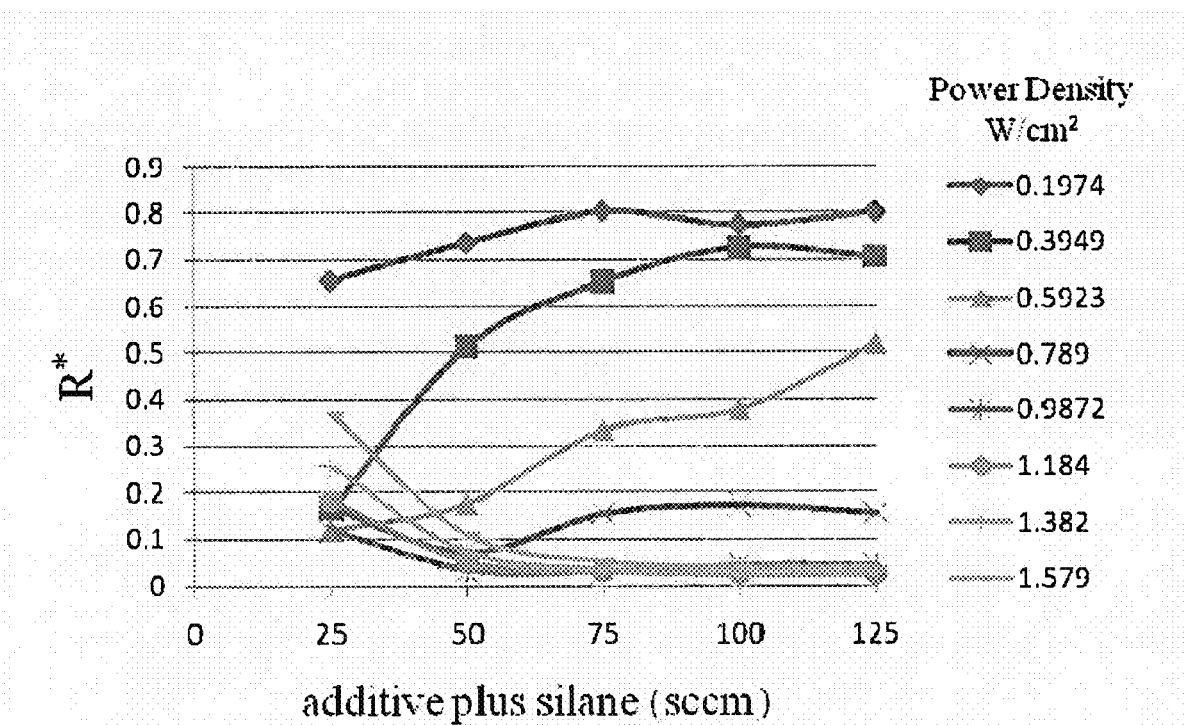
FIG. 4. The Empirical Microstructure Factor R* of hydrogenated silicon αSi:H versus the flow rate of the mixture of SiH4 and disilane under different power densities. The hydrogenated silicon αSi:H was, deposited using silane, disilane and hydrogen.

FIG. 4 illustrated Empirical Microstructure Factor $R^*$ as a function of the flow rate of mixture of silane with trisilane at different power densities, the trisilane was used as at least one additive. The percentage of Trisilane was 0.9%, Silane was at 8.1%, and Hydrogen was at 91%. The flow rate of the mixture of $SiH_4$ and trisilane ranged from 0 to 125 sccm; and the power densities were at 0.197, 0.394, 0.592, 0.789, 0.987, 1.184, 1.382 and 1.58 $W/cm^2$.

FIG. 4 has shown that as the flow rates of the mixture of silane and trisilane increased, $R^*$ value, that is, the % of Si—$H_2$ in the film decreased to less than 20% for all power densities greater than and equal to 0.789 $W/cm^2$. This gave the add benefit of the increased growth rate with the Empirical Microstructure Factor $R^*$ below 20% to produce a suitable solar grade material.

However, the $R^*$ values did not reach <20% for the power densities less than and equal to 0.5923 $W/cm^2$. This indicated that these films would not be a suitable solar grade material.

Thus, to deposit a suitable solar grade silicon film, both the Empirical Microstructure Factor $R^*$ value and the deposition rate are important factors.

As shown above in FIG. 4, although the deposition rates were higher at power densities less than and equal to 0.5923 $W/cm^2$ (comparing with the data shown in FIG. 2—no disilane used), however, due to the higher $R^*$ values (>20%), no suitable solar grade films can be deposited with trisilane as an additive at those power densities.

Deposition of Microcrystalline Silicon Film (μCSi:H)

The dual benefit of faster deposition and higher photoconductance can be achieved through the use of dual functional additives designed to incorporate the chemical features required to achieve both types of process enhancement.

The growth rate enhancement and photoconductivity maintaining are achieved through addition of at least one higher order silane from groups (a) to (e), while by incorporating at least one additional moiety from groups (h) and (i), such as a halogen, on the silane or, higher order silane, microcrystalline fraction is increased and the impact of film defects and impurities is reduced.

For example, molecules such as monchlorosilane ($SiH_3Cl$ or MCS), dichlorosilane ($SiH_2Cl_2$), chlorodisilane ($Si_2H_5Cl_2$) can be used as the at least one additional additives, in addition to growth rate enhanClng higher order silane, such as disilane and trisilane to the process yielding higher fractions of microcrystalinity in the deposited film.

PECVD process is used in depositing the microcrystalline silicon film (μCSi:H).

Figure 5:
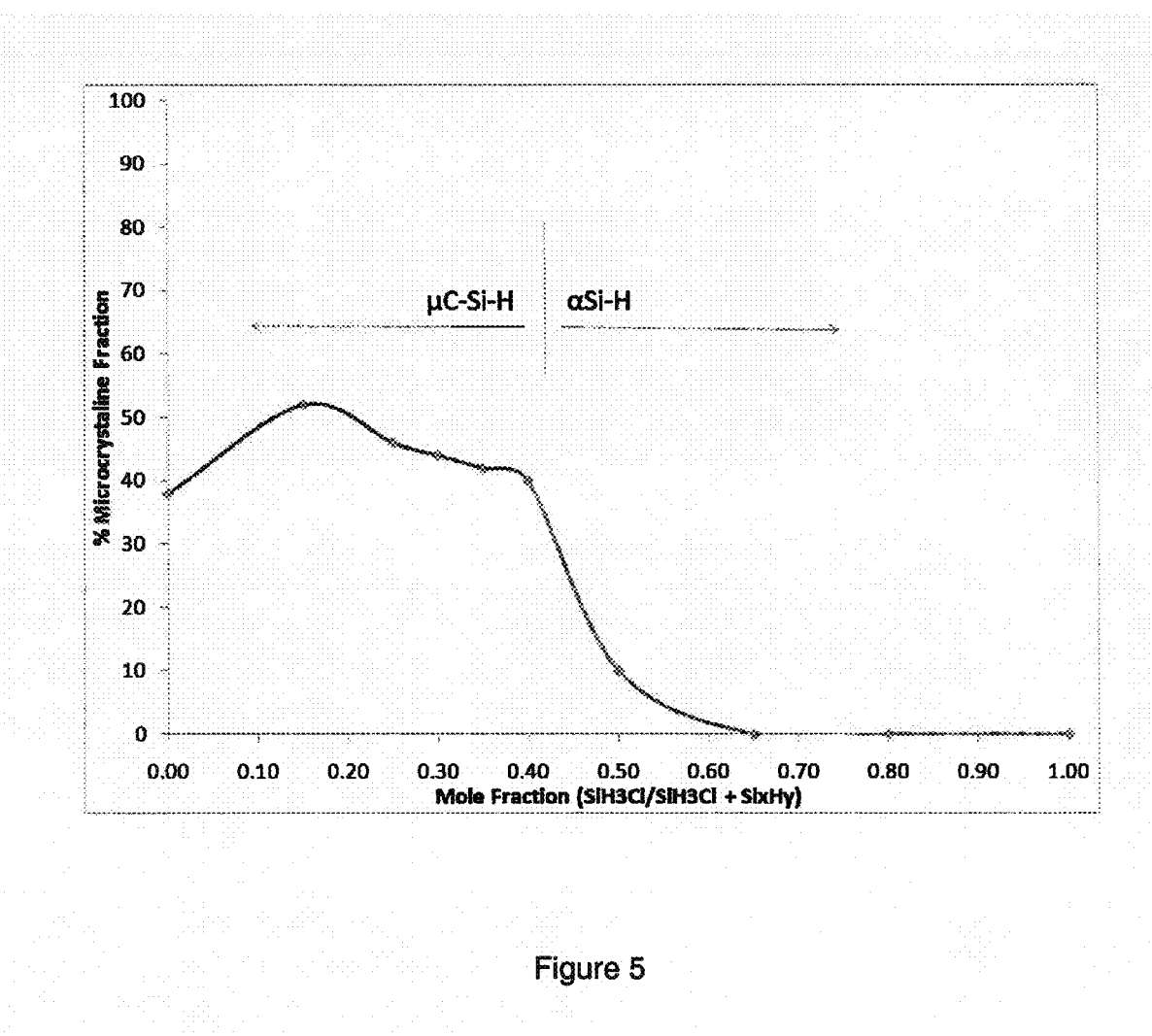
FIG. 5. The microcrystalline fraction versus the mole fraction $SiH_3Cl/(SiH_3Cl+Si_xH_y)$ %.

For the data obtained in FIG. 5, monchlorosilane ($SiH_3Cl$) is used as the at least one additional additive, the higher order silanes are represented by $Si_xH_y$, wherein x=2 to 20 and y=6 to 42.

The mixture of the halogenated silane $SiH_3Cl$ with silane ($SiH_4$) and, higher order silanes ($Si_xH_y$) is represented by ($SiH_3Cl+Si_xH_y$), wherein x=2 to 20 and y=6 to 42. The mole fraction $SiH_3Cl/(SiH_3Cl+Si_xH_y)$ % is the ratio of the halogenated silane $SiH_3Cl$ (MCS) to the mixture of the halogenated silane $SiH_3Cl$ with silane ($SiH_4$) and higher order silanes ($Si_xH_y$).

The flow rate of $H_2$ ranges from 91 to 99%, the flow rate of the mixture ranges from 1% to 9%. The preferred embodiment of the example is ($SiH_3Cl+Si_xH_y$) flows of 1-2% and $H_2$ flows of 98-99% based on the reactor plasma frequency of 13.56 MHz.

Those skilled in the art will realize that higher plasma frequenCles, such as 40.68 MHz, will permit higher, relative ($SiH_3Cl+Si_xH_y$) flows.

The film deposition in FIG. 5 is performed at 13.56 MHz using 1-9% silane, 1-9% higher order silane, and 1-9% $SiH_3Cl$, with total Si containing moieties not exceeding 9% (($SiH_4+SiH_3Cl+Si_xH_y$)<or equal 9%). The preferred embodiment of the present example is to use 1-2% silane, 0.1-0.2% higher order silane ($Si_xH_y$), 0.1-0.2% MCS, and with balance being hydrogen.

FIG. 5 shows the results of the change of the microcrystalline fraction as the function of the mole fraction of $SiH_3Cl/(SiH_3Cl+Si_xH_y)$ %. Applicants have found that all the higher order silanes functioned the same.

When no $SiH_3Cl$ is added, the Microcrystalline fraction is around 38%. The microcrystalline fraction reaches an optimum value about 51% at approximately 0.18 mole fraction of $SiH_3Cl/(SiH_3Cl+Si_xH_y)$ %, and trends down until the film becomes amorphous at >0.5 mole fraction. An optimal amount of Cl added to the deposition aids in the nucleation process for microcrystalline formation. As more Cl is added the film trends towards the amorphous phase. The speClfic mechanisms yielding optimized microcrystalline fractions at a given Cl partial pressure in the plasma are not fully understood but are suspected of being related to Cl aiding in the microcrystalline seeding process. Excess Cl disrupts the structured deposition of microcrystalline yielding higher degrees of amorphous silicon fractions within the deposited film.

FIG. 5 clearly indicates that the use of halogen substituted silanes in addition of higher order silanes will increase the microcrystalline fraction, providing an optimal band gap for the microcrystalline layer of 1.2 eV as part of the tandem solar cell.

Figure 6:
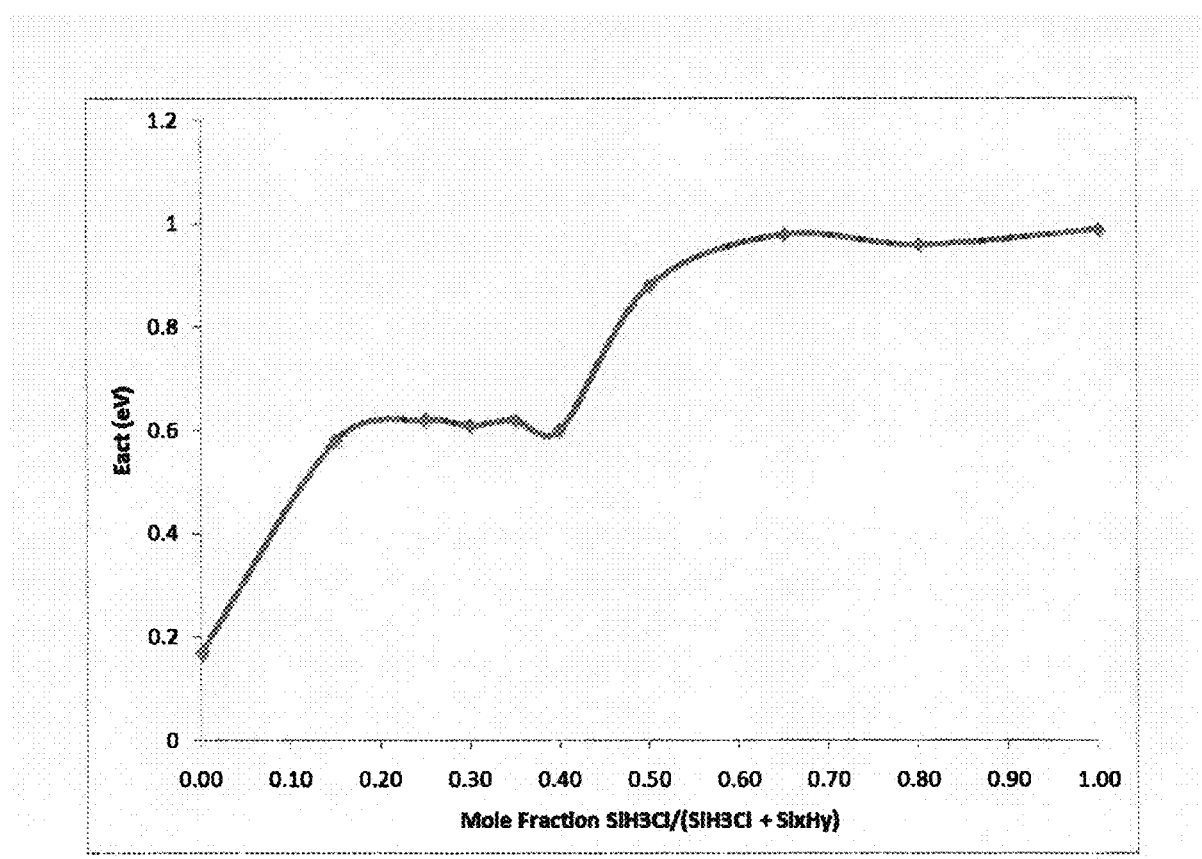
FIG. 6. The Activation Energy for deposited microcrystalline film versus the mole fractions of halogenated silanes $SiH_3Cl/SiH_3Cl+Si_xH_y)$ (%).

The film deposition conditions used in FIG. 6 are the same as in FIG. 5.

FIG. 6 shows the dark current activation energy versus the mole fractions of halogenated silanes $SiH_3Cl/(SiH_3Cl+Si_xH_y)$ %, wherein $Si_xH_y$=$SiH_4+Si_xH_y$ wherein x=2-20 and y=6-42. The dark current activation energy is the energy required to generate charge carriers in the absence of light for deposited microcrystalline As demonstrated in FIG. 6, the dark current activation energy ($E_{ACT}$) is impacted by the addition of chlorine to the process. The effect of chlorine addition increases dark current $E_{ACT}$ from 0.2 eV to approximately 0.6 eV indicating that the effects of chlorine addition are reduction of the effects of donor impurities such as oxygen on the deposited microcrystalline film at low mole fractions from 0.10 to 0.40 of halogenated silanes $SiH_3Cl/(SiH_3Cl+Si_xH_y)$ %, compared to the absence of added chlorine.

As shown in FIG. 6, at high chlorine mole fractions>0.5, $E_{ACT}$ increases as the film transitions from microcrystalline to amorphous phase.

Those results are believed to be attributed to Cl acting as an impurity scavenger reduClng the doping capaClty, of impurities. The enhancement in photoconductivity is realized by shifting the Fermi level to mid band gap for the enhanced growth rate intrinsic microcrystalline film.

The shift in Fermi level to the middle of the band gap at ca. 0.6 eV provides the optimal electrical bias for, a p-i-n type photovoltaic device that is the subject of this invention. The electrical bias inherent to the p-i-n structure aids in separation of charge carriers created in the intrinsic Si layer thus leading to higher degree of current extraction and higher degree of solar cell effiClency. The use of the appropriate quantity of halogen during deposition, from 0.1 to 0.4 mole fraction of the silane containing moieties, yields a film that is less impacted from the defects, such as impurity incorporation, that can occur during higher deposition rates.

Figures 5 and 6 have demonstrated that the use of higher order silanes and Halogen substituted silanes will increase the deposition rate, the microcrystalline fraction, and enhance the photoconductivity of the film. The present invention has demonstrated that the de position of αSi:H and μCSi:H at deposition rates 2-20 times higher than industry averages reported above. These include deposition rates for αSi:H of 10-200 Å/sec and for μCSi:H of 2-100 Å/sec.

The deposited αSi:H films for formation of single junction solar cells had effiClenCies of 5-15%. The deposited αSi:H and μCSi:H films for forming tandem junction solar cells had effiClenCies of 7-20%. Solar cell effiClency is defined as: Solar cell effiClency (%)=(Power out (W)×100%)/(Area $(m^2) \times 1000$ W/m$^2$). These effiClency improvements were the result from the addition of additives to the deposited films yielding enhanced photoconductivity.

The foregoing examples and description of the embodiments should be taken as illustrating, rather than as limiting the present invention as defined by the claims. As will be readily appreClated, numerous variations and combinations of the features set forth above can be utilized without departing from the present invention as set forth in the claims. Such variations are intended to be included within the scope of the following claims.

The invention claimed is;

1. A method of deposition for a solar grade amorphous silicon film (αSi:H) as a photoconductive film on a substrate, using
   Silane;
   hydrogen; and
   at least one additive selected from the group consisting of:
   (a) higher order straight chain silanes, comprising; disilane $Si_2H_6$, trisilane $Si_3H_8$, tetrasilane $Si_4H_{10}$, pentasilane $Si_5H_{12}$, hexasilane $Si_6H_{14}$, heptasilane $Si_7H_{16}$, octasilane $Si_8H_{18}$, nonasilane $Si_9H_{20}$, decasilane $Si_{10}H_{22}$ and mixtures thereof;
   (b) higher order branched silanes, comprising; 2-silyltrisilane $SiH_3$—$Si(H)(SiH_3)$—$SiH_3$, 2,2-disilyl-trisilane $SiH_3$—$Si(SiH_3)_2$—$SiH_3$, 2-silyl-tetrasilane $SiH_3$—$Si(H)(SiH_3)$—$SiH_2$—$SiH_3$, 2,3-disilyltetrasilane $SiH_3$—$SiH(SiH_3)$—$SiH(SiH_3)$—$SiH_3$, 2,2-disilyltetrasilane $SiH_3$—$Si(SiH_3)_2$—$SiH_2$—$SiH_3$, 3-silylpentasilane $SiH_3$—$SiH_2$—$SiH(SiH_3)$—$SiH_2$—$SiH_3$, 2-silylpentasilane $SiH_3$—$SiH(SiH_3)$—$SiH_2$—$SiH_2$—$SiH_3$, 2,3-disilylpentasilane $SiH_3$—$SiH(SiH_3)$—$SiH(SiH_3)$—$SiH_2$—$SiH_3$, 2,4disilylpentasilane $SiH_3$—$SiH(SiH_3)$—$SiH_2$—$SiH(SiH_3)$—$SiH_3$, 2-silylhexasilane $SiH_3$—$SiH(SiH_3)$—$(SiH_2)_3SiH_3$, 3-silylhexasilane $SiH_3$—$SiH_2$—$SiH(SiH_3)$—$(SiH_2)_2SiH_3$, 2,2disilylpentasilane $SiH_3$—$Si(SiH_3)_2$—$(SiH_2)_2$—$SiH_3$, 3,3-disilylpentasilane $SiH_3$—$SiH_2Si(SiH_3)_2$—$SiH_2$—$SiH_3$, 2,2,3-trisilyltetrasilane $SiH_3$—$Si(SiH_3)_2$—$SiH(SiH_3)$—$SiH_3$, 2silylheptasilane $SiH_3$—$SiH(SiH_3)$—$(SiH_2)_4$—$SiH_3$, 3-silylheptasilane $SiH_3$—$SiH_2$—$SiH(SiH_3)$—$(SiH_2)_3$—$SiH_3$, 4-silylheptasilane $SiH_3$—$(SiH_2)_2$—$SiH(SiH_3)$—$(SiH_2)_2$—$SiH_3$, 2,2-disilylhexasilane $SiH_3$—$Si(SiH_3)_2$—$(SiH_2)_3$—$SiH_3$, 2,3-disilylhexasilane $SiH_3$—$SiH(SiH_3)$—$SiH(SiH_3)$—$(SiH_2)_2$—$SiH_3$, 2,4-disilylhexasilane $SiH_3$—$SiH(SiH_3)$—$SiH_2$—$SiH(SiH_3)$—$SiH_2$—$SiH_3$, 2,5-disilylhexasilane $SiH_3$—$SiH(SiH_3)$—$(SiH_2)_2$—$SiH(SiH_3)$ $SiH_3$, 3,3-disilylhexasilane $SiH_3$—$SiH_2$—$Si(SiH_3)_2$—$(SiH_2)_2$—$SiH_3$, 3,4disilylhexasilane $SiH_3$—$SiH_2$—$SiH(SiH_3)$—$SiH(SiH_3)$—$SiH_2$—$SiH_3$, 2,2,3trisilylpentasilane $SiH_3$—$Si(SiH_3)_2$—$SiH(SiH_3)$—$SiH_2$—$SiH_3$, 2,2,4-trisilylpentasilane $SiH_3$—$Si(SiH_3)_2$—$SiH_2$—$SiH(SiH_3)$—$SiH_3$, 2,3,3-trisilylpentasilane $SiH_3$—$SiH(SiH_3)$—$Si(SiH_3)_2$—$SiH_2$—$SiH_3$, 2,3,4-trisilylpentasilane $SiH_3$—$SiH(SiH_3)$—$SiH(SiH_3)$—$SiH(SiH_3)$—$SiH_3$, 2,2,3,3-tetrasilyltetrasilane $SiH_3$—$Si(SiH_3)_2$—$Si(SiH_3)_2$—$SiH_3$ and mixtures thereof;
   (c) cyclic silanes, selected from the group consisting of; cyclotrisilane $Si_3H_6$ cyclotetrasilane $Si_4H_8$, cyclopentasilane $Si_5H_{10}$, cyclohexasilane $Si_6H_{10}$, and mixtures thereof;
   (d) silyl substituted cyclic silanes, selected from the group consisting of; silyl cyclotetrasilane SiH3—$Si_4H_7$, 1,2-disilylcyclopentasilane $(SiH_3)_2$—$Si_5H_8$, silyl cyclohexasilane $SiH_3$—$Si_6H_{11}$, 1,3-disilylcyclohexasilane $(SiH_3)_2$—$Si_6H_{10}$, and mixtures thereof;
   (e) silyl substituted silanes, selected from the group consisting of; 2-tetrasilane $SiH_3$—$SiH$=$SiH$—$SiH_3$, 2,3-disilyltetrasil-2-ene $SiH_3$—$Si(SiH_3)$=$Si(SiH_3)$—$SiH_3$, 2,3disilylpentasil-2-ene $SiH_3$—$Si(SiH_3)$=$Si(SiH_3)$—$SiH_2$—$SiH_3$, 2,5-disilylhexasil-2-ene $SiH_3$—$Si(SiH_3)$=$SiH$—$SiH2$—$SiH(SiH_3)$—$SiH_3$, 2,3,4-trisilylhexasil-2-ene $SiH_3$—$Si(SiH_3)$=$Si(SiH_3)$—$SiH(SiH_3)$—$SiH_2$—$SiH_3$, and mixtures thereof;
   (f) halogen substituted silanes, including; 1,1-dichlordisilane $SiHCl_2SiH_3$, 1,1,1,2-tetrafluorodislane $SiF_3$—$SiH_2F$, 1,2-dichloro-1,2-difluorotetrasilane $SiHClF$—$SiClF$—$SiH_2$—$SiH_3$, 1,1,1-trichlorotrisilane $SiCl_3$—$SiH_2$—$SiH_3$, 1,1-difluoro1,2,2-trichlorosilane $SiF_2Cl$—$SiCl_2$—$SiH_3$, chloropentasilane $SiH_2Cl$—$(SiH_2)_3$—$SiH_3$, and other compounds of the general formula $Si_wH_{2w+2-z}X_z$ where X =F, Cl, Br, 1; w can be 1 to 20 and z can be 1 to 2w+2; 2-chlorotetrasil-2-ene $SiH_3$—$SiCl$=$SiH$—$SiH_3$, 1,1-dichloro-2-fluoropentasil-2-ene $SiHCl_2$—$SiF$=$SiH_2$—$SiH_2$—$SiH_3$, 2,3-dichlorotetrasil-2-ene $SiH_3$—$SiCl$=$SiCl$—$SiH_3$, and other compounds of the general formula $Si_wH_{2w}X'_z$ where X'=F, Cl, Br, I; and, w can be 2 to 20 and z can be 1 to 2w; and mixtures thereof; and
   (g) halogen substituted cyclic silanes, selected from the group consisting of; chlorocyclopentasilane $Si_5H_9Cl$, dodecachlorocyclohexasilane $Si_6Cl_{12}$, 1chloro-1fluorocyclopentasilane $Si_5H_8FCl$, and mixtures thereof;
   wherein the silane used is at 5 to 10%, and the at least one additive used is at 0.01 to 5%, and the rest is hydrogen.

2. The method of deposition for the solar grade amorphous silicon film (αSi:H) of claim 1, wherein the deposition is performed at a substrate temperature of 25°-500° C., and pressure of 0.01 torr to 15 torr.

3. The method of deposition for the solar grade amorphous silicon film (αSi:H) of claim 2, wherein the substrate temperature is at 150°-250° C.

4. The method of deposition for the solar grade amorphous silicon film (αSi:H) of claim 1, wherein the deposition is a process selected from the group consisting of Chemical Vapor Deposition (CVD), Plasma Enhanced Chemical Vapor Deposition (PECVD), Low Pressure Chemical Vapor Deposition (LPCVD), Hot Wire Chemical Vapor Deposition (HWCVD), Initiated Chemical Vapor Deposition (ICVD) and Sub Atmospheric Chemical Vapor Deposition (SA-CVD).

5. The method of deposition for the solar grade amorphous silicon film (αSi:H) of claim 1, wherein the deposition is a plasma enhanced chemical vapor deposition at a plasma power density ranging from 0.19 -1.6W/cm$^2$ and a plasma frequency ranging from 13.56 to 40.68 MHz.

6. The method of deposition for the solar grade amorphous silicon film (αSi:H) of claim 5 having a deposition rate ranging from 10 - 200 Å/sec.

7. The method of deposition for the solar grade amorphous silicon film (αSi:H) of claim 5, wherein a deposited film provides a single junction solar cell having efficiencies of 5 -15%; and a tandem junction solar cell having efficiencies of 7 - 20%.

8. A method of deposition for a solar grade amorphous silicon film (αSi:H) or a microcrystalline silicon film (μCSi:H) having high microcrystalline fraction as a photoconductive film on a substrate, using
Silane;
hydrogen; and
at least one additive selected from the group consisting of:
(a) halogen substituted higher order silanes, including; 1,1-dichlordisilane SiHCl$_2$SiH$_3$, 1,1,1,2-tetrafluorodislane SiF$_3$—SiH$_2$F, 1,2-dichloro-1,2difluorotetrasilane SiHClF—SiClF—SiH$_2$—SiH$_3$, 1,1,1-trichlorotrisilane SiCl$_3$—SiH$_2$—SiH$_3$, 1,1-difluoro-1,2,2-trichlorosilane SiF$_2$Cl—SiCl$_2$—SiH$_3$, chloropentasilane SiH$_2$Cl—(SiH$_2$)$_3$—SiH$_3$, and other compounds of the general formula Si$_w$H$_{2w+2-z}$X$_z$ where X=F, Cl, Br, I; w can be 1 to 20 and z can be 1 to 2w+2; 2chlorotetrasil-2-ene SiH$_3$—SiCl=SiH—SiH$_3$, 1,1-dichloro-2-fluoropentasil-2-ene SiHCl$_2$—SiF=SiH$_2$—SiH$_2$—SiH$_3$, 2,3-dichlorotetrasil-2-ene SiH$_3$—SiCl=SiCl—SiH$_3$, and other compounds of the general formula Si$_w$H$_{2w-z}$ X'$_z$ where X'=F, Cl, Br, I; and, w can be 2 to 20 and z can be 1 to 2w; and mixtures thereof; and
(b) halogen substituted cyclic higher order silanes, selected from the group consisting of; chlorocyclopentasilane Si$_5$H$_9$Cl, dodecachlorocyclohexasilane Si$_6$Cl$_{12}$, 1-chloro-1fluorocyclopentasilane Si$_5$H$_8$FCl, and mixtures thereof.

9. The method of deposition for the solar grade amorphous silicon film (αSi:H) or the microcrystalline silicon film (μCSi:H) having high microcrystalline fraction of claim 8, wherein the silane used is at 5 to 10%, and the at least one additive used is at 0.01 to 5%, and the rest is hydrogen.

10. The method of deposition for the solar grade amorphous silicon film (αSi:H) or the microcrystalline silicon film (μCSi:H) having high microcrystalline fraction of claim 8, wherein the deposition is a process selected from the group consisting of Chemical Vapor Deposition (CVD), Plasma Enhanced Chemical Vapor Deposition (PECVD), Low Pressure Chemical Vapor Deposition (LPCVD), Hot Wire Chemical Vapor Deposition (HWCVD), Initiated Chemical Vapor Deposition (ICVD) and Sub Atmospheric Chemical Vapor Deposition (SA-CVD).

11. The method of deposition for the solar grade amorphous silicon film (αSi:H) or the microcrystalline silicon film (μCSi:H) having high microcrystalline fraction of claim 8, wherein the deposition is a plasma enhanced chemical vapor deposition at a plasma power density ranging from 0.19 -1.6 W/cm$^2$ and a plasma frequency ranging from 13.56 to 40.68 MHz.

12. The method of deposition for the solar grade amorphous silicon film (αSi:H) or the microcrystalline silicon film (μCSi:H) having high microcrystalline fraction of claim 11, having a deposition rate of 10 - 200Å/sec for amorphous silicon film (αSi:H) and 10 - 100 Å/sec for microcrystalline silicon film (μCSi:H).

13. The method of deposition for the solar grade amorphous silicon film (αSi:H) or the microcrystalline silicon film (μCSi:H) having high microcrystalline fraction of claim 11, wherein the deposited amorphous silicon film (αSi:H) provides a single junction solar cell having efficiencies of 5 -15%; and the deposited amorphous silicon film (αSi:H) or microcrystalline silicon film (μCSi:H) provides a tandem junction solar cell having efficiencies of 7 - 20%.

* * * * *